(12) United States Patent
Noh et al.

(10) Patent No.: US 8,193,600 B2
(45) Date of Patent: Jun. 5, 2012

(54) SHARED-PIXEL-TYPE IMAGE SENSOR AND METHOD OF FABRICATING THE SAME

(75) Inventors: Hyun-Pil Noh, Seongnam-si (KR); Duck-Hyung Lee, Seongnam-si (KR); Doo-Cheol Park, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 550 days.

(21) Appl. No.: 12/416,703

(22) Filed: Apr. 1, 2009

(65) Prior Publication Data

US 2009/0261443 A1  Oct. 22, 2009

(30) Foreign Application Priority Data

Apr. 18, 2008  (KR) .................. 10-2008-0036375

(51) Int. Cl.
*H01L 21/00* (2006.01)
(52) U.S. Cl. .............. 257/443; 257/292; 257/462
(58) Field of Classification Search ............... 257/443, 257/292, 462
See application file for complete search history.

(56) References Cited

U.S. PATENT DOCUMENTS

| | | | | |
|---|---|---|---|---|
| 7,180,151 B2 * | 2/2007 | Park | .............................. | 257/462 |
| 7,518,172 B2 * | 4/2009 | Moon et al. | .................... | 257/292 |
| 7,579,208 B2 * | 8/2009 | Park | .............................. | 438/57 |
| 7,667,183 B2 * | 2/2010 | Lee et al. | .................... | 250/214.1 |
| 7,671,314 B2 * | 3/2010 | Lee et al. | .................... | 250/208.1 |
| 7,825,416 B2 * | 11/2010 | Gambino et al. | ............... | 257/72 |
| 7,910,965 B2 * | 3/2011 | Lee et al. | ...................... | 257/292 |
| 7,994,551 B2 * | 8/2011 | Park et al. | ...................... | 257/292 |
| 2006/0006489 A1 * | 1/2006 | Park | ............................... | 257/462 |
| 2007/0023802 A1 * | 2/2007 | Oh et al. | ......................... | 257/292 |
| 2007/0075338 A1 * | 4/2007 | Park et al. | ...................... | 257/222 |
| 2007/0111361 A1 * | 5/2007 | Park | ............................... | 438/48 |
| 2007/0194356 A1 * | 8/2007 | Moon et al. | .................... | 257/291 |
| 2007/0210239 A1 * | 9/2007 | Lee et al. | .................... | 250/208.1 |
| 2008/0087733 A1 * | 4/2008 | Park et al. | ................. | 235/462.25 |
| 2008/0179642 A1 * | 7/2008 | Lee et al. | ...................... | 257/292 |
| 2008/0308852 A1 * | 12/2008 | Lee et al. | ...................... | 257/292 |
| 2009/0021630 A1 * | 1/2009 | Hasegawa | ...................... | 348/311 |
| 2009/0101948 A1 * | 4/2009 | Park et al. | ...................... | 257/292 |
| 2009/0200627 A1 * | 8/2009 | Moon et al. | ..................... | 257/432 |
| 2009/0224349 A1 * | 9/2009 | Gambino et al. | .............. | 257/432 |
| 2009/0261443 A1 * | 10/2009 | Noh et al. | ...................... | 257/443 |
| 2010/0097514 A1 * | 4/2010 | McCarten et al. | ............ | 348/340 |
| 2010/0163940 A1 * | 7/2010 | Jang | ............................... | 257/292 |
| 2011/0163362 A1 * | 7/2011 | Park et al. | ...................... | 257/292 |

FOREIGN PATENT DOCUMENTS

| | | |
|---|---|---|
| JP | 2006-186187 | 7/2006 |
| KR | 1020060126245 | 7/2006 |
| KR | 1020070035243 | 3/2007 |

* cited by examiner

*Primary Examiner* — Laura Menz
(74) *Attorney, Agent, or Firm* — F. Chau & Associates, LLC

(57) ABSTRACT

A shared-pixel-type image sensor including a shared floating diffusion region formed in a semiconductor substrate; first and second adjacent photoelectric conversion regions sharing the floating diffusion region; two transmission elements that alternately transfer electric charges accumulated in the first and second photoelectric conversion regions to the shared floating diffusion region, respectively; a drive element for outputting the electric charges of the shared floating diffusion region; a first contact formed on the floating diffusion region; a second contact formed on the drive element; and a local wire that connects the first and second contacts to electrically connect the floating diffusion region and the drive element, wherein the local wire is formed at a level lower than respective top surfaces of the first and second contacts.

13 Claims, 10 Drawing Sheets

SHARED-PIXEL-TYPE IMAGE SENSOR AND METHOD OF FABRICATING THE SAME

This application claims priority, under 35 U.S.C. §119, of Korean Patent Application No. 10-2008-0036375 filed on Apr. 18, 2008 in the Korean Intellectual Property Office, which is incorporated herein by reference in its entirety.

BACKGROUND OF THE INVENTION

1. Field of the Invention

The present invention relates to image sensors. More particularly, the present invention relates to a shared-pixel-type image sensor with enhanced light-receiving efficiency and a method of fabricating the same.

2. Description of the Related Art

Image sensors convert optical images into electrical signals. The demands for image sensors with enhanced performance are increasing in various fields such as digital cameras, camcorders, personal communication systems (PCSs), game devices, security cameras, and micro-cameras for medical use.

Complementary metal oxide semiconductor (CMOS) image sensors can be driven using a simple digital driving method and can be output using various scanning methods. In CMOS image sensors, signal-processing circuits can be integrated onto a single chip. Thus, the size of a product including such a CMOS image sensor can be reduced compared with charge-coupled device (CCD) image sensors. In addition, since CMOS image sensors are compatible with CMOS processing technology, manufacturing costs can be reduced. Due to their low power consumption, CMOS image sensors can be applied in mobile products with limited battery capacity. As pixel integration (size reduction) is improved to achieve increased resolution, the area occupied by the photoelectric conversion element in each unit pixel is also reduced. The area occupied by reading elements that read optical signals incident on the photoelectric conversion elements, formed in the peripheral area, also decreases. Products including smaller photoelectric conversion elements may have lower sensitivity and less saturation of signals. An active pixel sensor array with a plurality of photoelectric conversion elements sharing (multiplexing) a smaller number of reading elements (e.g., pass-transistors, lines, sensors) has been proposed. Since the photoelectric conversion elements, which function as light-receiving units, share the reading elements, the area of each photoelectric conversion element can be maximized, thereby increasing light-receiving efficiency. Thus, a shared-pixel-type image sensor, in which two or four photoelectric conversion elements adjacent to each other in a direction share one set of reading elements, has been proposed.

In a shared-pixel-type image sensor, some of the reading elements (pass-transistors) are formed in a different active region isolated from an active region in which a photoelectric conversion element is formed. In addition, the shared-pixel-type image sensor requires a wire for connecting a floating diffusion region to a drive element. The floating diffusion region and the drive element are formed in different active regions of the shared-pixel-type image sensor. Accordingly, a conductor (e.g., metal wire) for connecting between the floating diffusion region and the drive element must be formed in the shared-pixel-type image sensor.

When wires required in a shared-pixel-type image sensor are designed, an exposed area of a top surface of each photoelectric conversion element is maximized in order to increase a fill factor. However, as the size of a device is reduced while the number of wires required increases, the exposed area between metal wires is reduced, reducing the fill factor. Therefore, it is desirable to increase the exposed area between the metal wires.

SUMMARY OF THE INVENTION

A first aspect of the present invention provides a shared-pixel-type image sensor with enhanced light-receiving efficiency. Another aspect of the present invention provides a method of fabricating a shared-pixel-type image sensor with enhanced light-receiving efficiency.

According to an exemplary embodiment of the present invention, there is provided a shared-pixel-type image sensor including: a shared floating diffusion region formed in a semiconductor substrate; first and second photoelectric conversion regions which are formed in the semiconductor substrate and are adjacent to each other in a first direction; two transmission elements that alternately transfer electric charges accumulated in the first and second photoelectric conversion regions to the shared floating diffusion region, respectively; a drive element that outputs the electric charges of the shared floating diffusion region; a first contact formed on the shared floating diffusion region; a second contact formed on the drive element; and a local wire that connects the first and second contacts to electrically connect the shared floating diffusion region and the drive element, wherein the local wire is formed at a level lower than respective top surfaces of the first and second contacts.

According to another exemplary embodiment of the present invention, there is provided a shared-pixel-type image sensor including: four photoelectric conversion regions which are formed in a semiconductor substrate and are adjacent to one another in a column direction; two transmission elements which alternately transfer electric charges accumulated in two adjacent ones of the four photoelectric conversion regions to a first shared floating diffusion region, respectively; another two transmission elements which alternately transfer electric charges accumulated in the other two adjacent ones of the four photoelectric conversion regions to a second shared floating diffusion region, respectively; a drive element that outputs (amplifies) the electric charges of the first or second shared floating diffusion region; a first contact formed on the first shared floating diffusion region; a second contact formed on the second shared floating diffusion region; a third contact formed on the drive element; and a local wire that connects the first through third contacts to electrically connect the first and second shared floating diffusion regions and the drive element, wherein the local wire is formed at a level lower than respective top surfaces of the first through third contacts.

According to another aspect of the present invention, there is provided a method of fabricating a shared-pixel-type image sensor. The method includes: forming, in a semiconductor substrate, a shared floating diffusion region, a plurality of photoelectric conversion regions adjacent to each other in the column direction, and a drive element that outputs (amplifies) electric charges of the shared floating diffusion region; depositing a first inter-layer insulating film on the semiconductor substrate; forming a local wire on the first inter-layer insulating film;

depositing a second inter-layer insulating film on the first inter-layer insulating film and on the local wire; and forming first and second contacts that penetrates the first and second inter-layer insulating films, wherein the first contact is connected to the shared floating diffusion region and the second contact is connected to the drive element, wherein the first and second contacts are connected to the local wire.

Features of the present invention and methods of making the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In some embodiments, well-known device structures and well-known technologies will not be specifically described in order to avoid ambiguous interpretation of the present invention.

It will be understood that when an element is referred to as being "connected to" or "coupled to" or "on" another element, it can be directly connected or coupled to or on the other element or intervening elements may be present. In contrast, when an element is referred to as being "directly connected to" or "directly coupled to" or "directly on" another element, there are no intervening elements present.

The terminology used herein is for the purpose of describing particular embodiments only and is not intended to be limiting of the invention. As used herein, the singular forms are intended to include the plural forms as well, unless the context clearly indicates otherwise.

Spatially relative terms, such as "below," "beneath," "lower," "above," "over", "overlapping", "on" "upper," and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings. For example, if the device in the figures is turned over, elements described as "below" or "beneath" other elements or features would then be oriented "above" the other elements or features. Thus, the exemplary term "below" can encompass both an orientation of above and below. The device may be otherwise oriented and the spatially relative descriptors used herein interpreted accordingly.

In exemplary embodiments of the present invention, a complementary metal-oxide semiconductor (CMOS) image sensor will be described as an example. However, the present invention is not limited thereto. An image sensor according to the present invention may be any image sensor fabricated by using an n-channel metal-oxide semiconductor (NMOS) process, a p-channel metal-oxide semiconductor (PMOS) process, or a CMOS process that uses both the NMOS and PMOS processes.

In the exemplary embodiments of the present invention, a four-transistor image sensor will be described as an example. However, the present invention is not limited thereto. The image sensor according to the present invention may be a three-transistor image sensor or a five-transistor image sensor.

In addition, in the exemplary embodiments of the present invention, a 2-shared-pixel-type image sensor and a 4-shared-pixel-type image sensor will be described as examples. However, the present invention is not limited thereto. A shared-pixel-type image sensor according to the present invention may be any shared-pixel-type image sensor having an array of shared pixels, each including a plurality of photoelectric conversion elements which share reading elements.

The above and other aspects of the present invention will become more apparent to one of ordinary skill in the art to which the present invention pertains by referencing the drawings and the detailed description of exemplary embodiments of the present invention given below.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF EXEMPLARY EMBODIMENTS OF THE INVENTION

Figure 1:
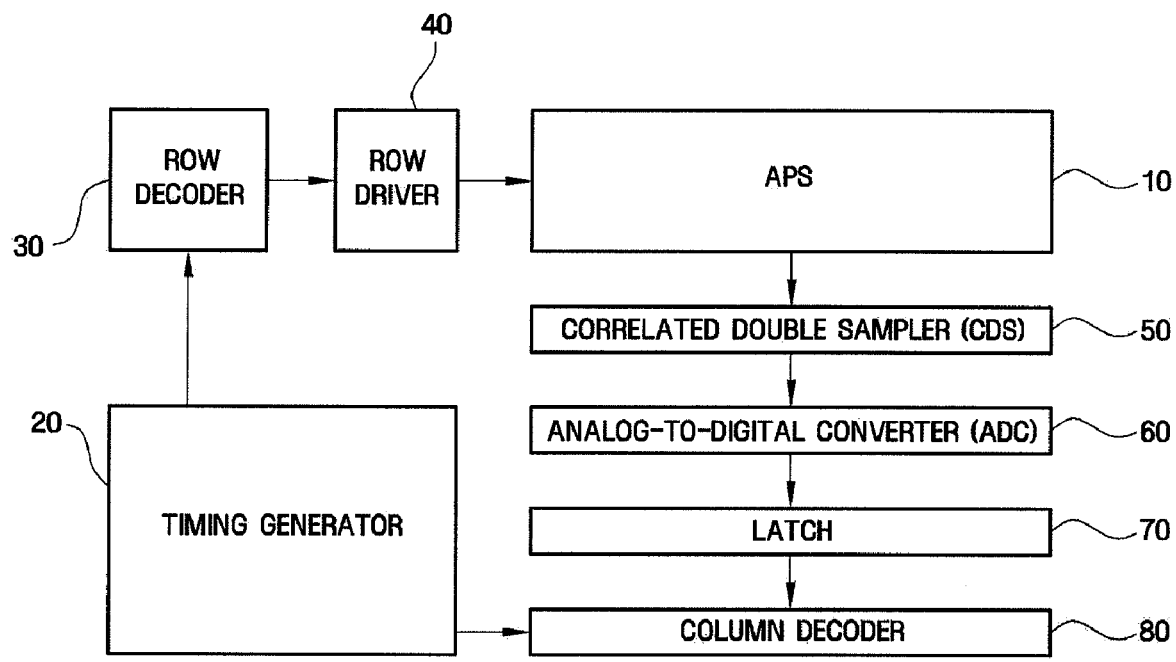
FIG. 1 is a block diagram of an image sensor employing one or more aspects of the present invention.

FIG. 1 is a block diagram of an image sensor employing one or more aspects of the present invention. Referring to FIG. 1, the shared-pixel-type image sensor according to an exemplary embodiment of the present invention includes an active pixel sensor (APS) array 10, a timing generator 20, a row decoder 30, a row driver 40, a correlated double sampler (CDS) 50, an analog-to-digital converter (ADC) 60, a latch 70, and a column decoder 80.

The APS array 10 includes a plurality of pixels two-dimensionally arranged, and each of the pixels in the APS array 10 includes a photoelectric conversion element. A group of photoelectric conversion elements share one set of reading elements. Specifically, the APS array 10 according to the exemplary embodiments of the present invention includes a plurality of 2 or 4 pixel groups arranged in a matrix, and each of the 2 or 4 pixels includes a photoelectric conversion element that share the same reading elements. When shared reading elements are used as described above, the total area occupied by the reading elements in the APS array 10 may be reduced, and the resultant area may be used to increase the sizes of the photoelectric conversion elements. Consequently, light-receiving efficiency and sensitivity may be enhanced, and the saturation of signals may be increased.

The photoelectric conversion elements of each pixel converts an optical image into an electrical signal. The pixels in the APS array 10 are driven by a plurality of driving signals, such as a pixel selection signal SEL, a reset signal RX and a charge transmission signal TX, received from the row driver 40. The electrical signal converted from the optical image is provided to the CDS 50 via a shared vertical signal line among the shared reading elements.

The timing generator 20 provides a timing signal and a control signal to the row decoder 30 and to the column decoder 80.

Based on the decoding result output from the row decoder 30, the row driver 40 provides the APS array 10 with a plurality of driving signals for driving a plurality of pixels, i.e., the 2 or 4 pixel groups. Generally, when the pixels are arranged in a matrix, the row driver 40 provides a driving signal to each row of the matrix.

The CDS 50 receives the electrical signals from the APS 10 via the vertical signal lines and samples and holds the received electrical signals. The CDS 50 samples a reset level representing pixel a noise level and a signal level of the electrical signal and outputs a difference level between the specified noise level and the signal level to one of the reading elements.

The ADC 60 converts an analog signal on each of the reading elements, which corresponds to the difference level, into a digital signal and outputs the digital signals.

The latch 70 unit latches the digital signals. Latched signals are sequentially provided to an image signal processor (not shown) based on the decoding result output from the column decoder 80.

In each group of pixels, the photoelectric conversion elements, which share the reading elements, may be adjacent to each other in a column or row direction of the APS array 10. However, since most image sensors adopt a row driving method (e.g., a rolling shutter method) in which a driving signal is provided to each row of pixels as shown in FIG. 1, the group of photoelectric conversion elements that share the reading elements, are preferably disposed adjacent to each other in the column direction in order to enhance reading efficiency.

Figure 2:
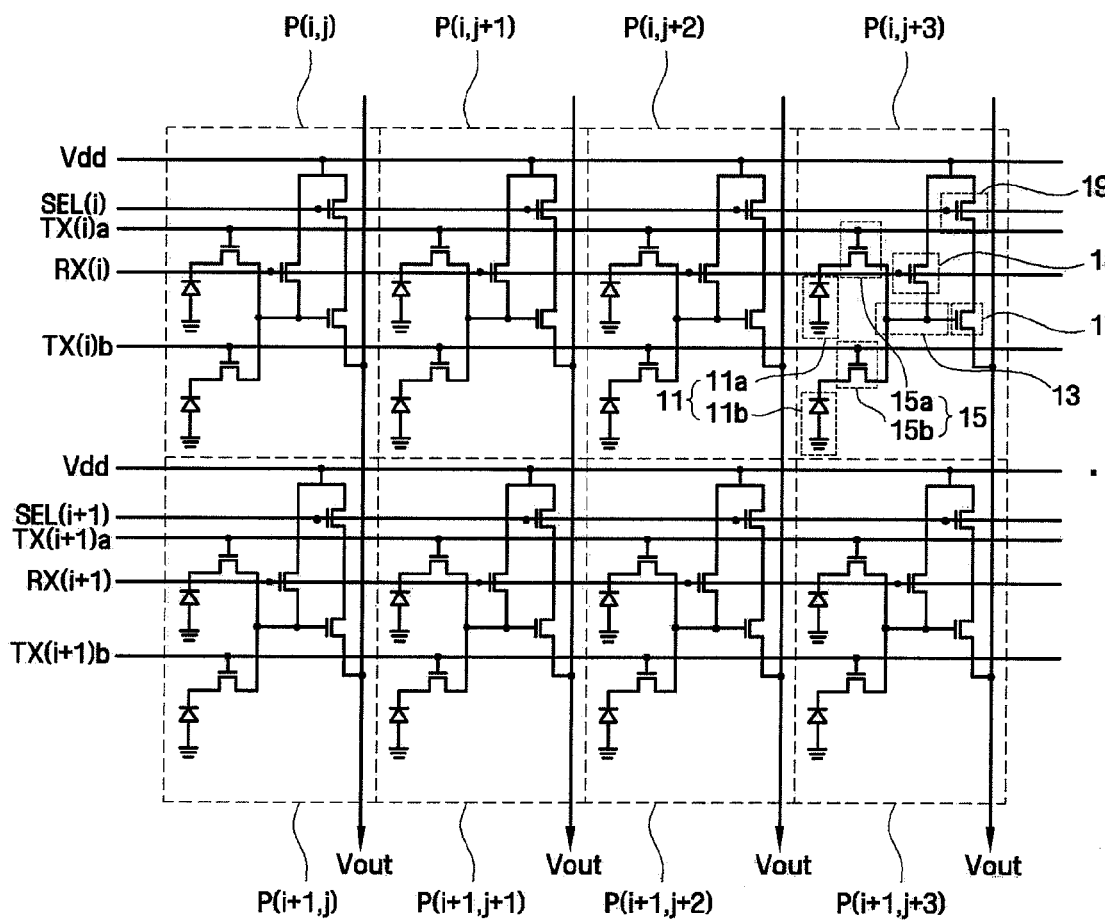
FIG. 2 is an equivalent circuit diagram of an active pixel sensor (APS) array of a shared-pixel-type image sensor according to a first exemplary embodiment of the present invention.

Hereinafter, a shared-pixel-type image sensor according to a exemplary embodiment of the present invention will be described with reference to FIG. 2 through FIG. 5. FIG. 2 is an equivalent circuit diagram of a portion of an APS array of a shared-pixel-type image sensor according to a first exemplary embodiment of the present invention.

Referring to FIG. 2, a plurality of 2-pixel groups P are arranged in a matrix to form an APS array. In each of the 2-pixel groups P, two photoelectric conversion elements (e.g., photo diodes 11a and 11b), which are adjacent to each other in the column direction of the APS array, share reading elements (e.g., 13, 17). The reading elements, (e.g., 13, 17), read voltages across the photoelectric conversion elements (e.g., photo diodes 11a and 11b) representing optical signals incident on the photoelectric conversion elements. The reading elements may include, for example, a read enable switch, a drive element and/or a reset element.

Specifically, each of the 2-pixel groups P includes two photoelectric conversion elements 11a and 11b adjacent to each other in the column direction of the APS array. Each of the photoelectric conversion elements 11a and 11b absorbs incident light and accumulates electric charges corresponding to the amount of the incident light. The photoelectric conversion elements 11a and 11b may be photodiodes (PDs), phototransistors, photogates, pinned photodiodes (PPDs), or a combination of the same. In the drawing, PDs are shown as an example of the photoelectric conversion elements 11a and 11b.

The photoelectric conversion elements 11a and 11b are coupled to corresponding transmission elements (charge pass gates) 15a and 15b that transfer accumulated electric charges of a selected one of the photoelectric conversion elements 11a and 11b to a floating diffusion region 13. The floating diffusion region 13 is an region where electric charges are converted into a voltage. Because the floating diffusion region 13 has parasitic capacitance, electric charges are accumulated and stored in the floating diffusion region 13.

In each 2-pixel group P, the two photoelectric conversion elements 11a and 11b share the reading elements, e.g., a drive element 17, a reset element 18 and a read enable switch 19. The functions of the drive element 17, the reset element 18 and the read enable switch 19 will be described by using the $i^{th}$ row of pixels P(i, j), P(i, j+1), P(i, j+2), P(i, j+3), etc., as an example.

The drive element 17, which is implemented as a source follower amplifier, amplifies a change in the electric potential of the floating diffusion region 13 that receives electric charges accumulated in the currently selected one of the photoelectric conversion elements 11a and 11b, and outputs the amplified signal to an output line Vout.

The reset element 18 periodically resets the floating diffusion region 13 to a predetermined potential (voltage). The reset element 18 may include a MOS transistor driven by a predetermined bias provided by a reset line RX(i). When the reset element 18 is turned ON by the bias provided by the reset line RX(i), a predetermined electric potential provided to the drain of the reset element 18, for example, a power supply voltage VDD, is provided to the floating diffusion region 13.

The read enable switch 19 selects the 2-pixel group P, to be read, on a row-by-row basis. The read enable switch 19 may include a MOS transistor driven by a bias provided by a row select line SEL(i). When the read enable switch 19 is turned ON by the bias provided by the $i^{th}$ row select line SEL(i), a predetermined electric potential provided to the drain of the read enable switches 19 in the $i^{th}$ row, for example, the power supply voltage VDD, is provided to the drain of the drive element 17.

Transmission lines TX(i)a and TX(i)b apply biases to the charge pass gates 15a and 15b, to the reset line RX(i) that applies a bias to the reset element 18, and to the $i^{th}$ row select line SEL(i) that applies a bias to the read enable switch 19, and may extend substantially parallel to each other in the row direction of the APS array.

Figure 3A:
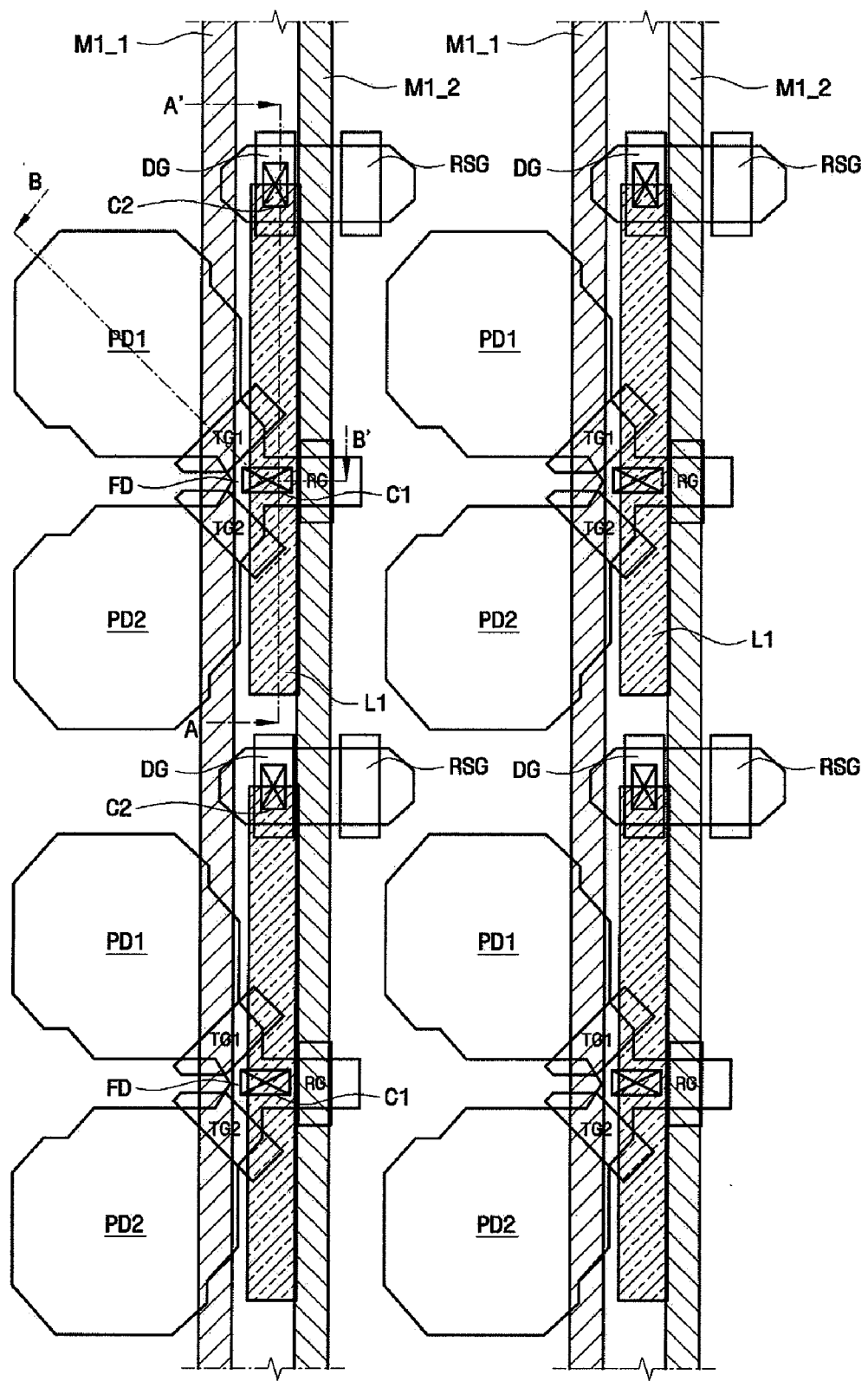
FIG. 3A is a layout diagram of a shared-pixel-type image sensor according to the first exemplary embodiment of the present invention.
Figure 3B:
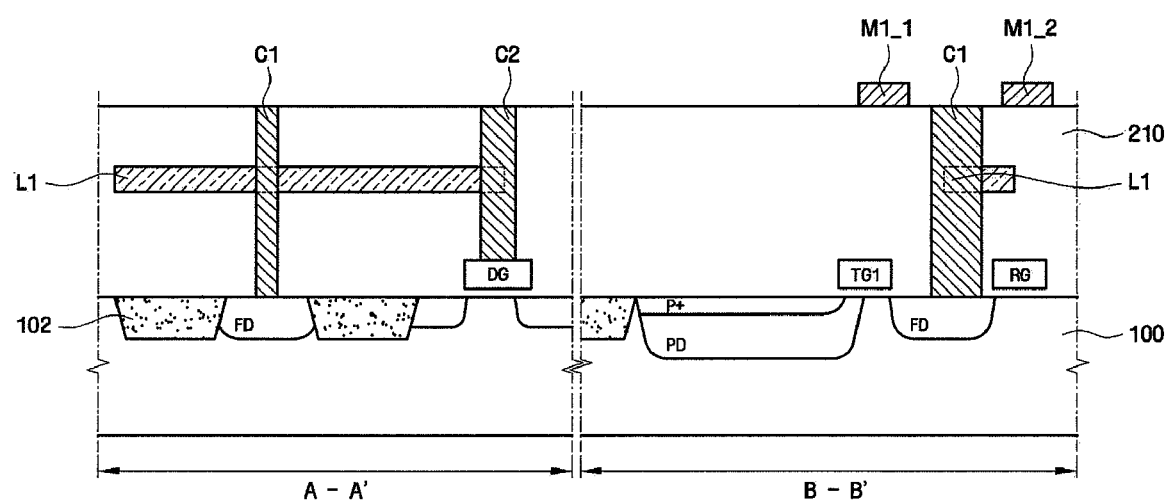
FIG. 3B is a cross-sectional view of the shared-pixel-type image sensor taken along section lines A-A' and B-B' of FIG. 3A.
Figure 4A:
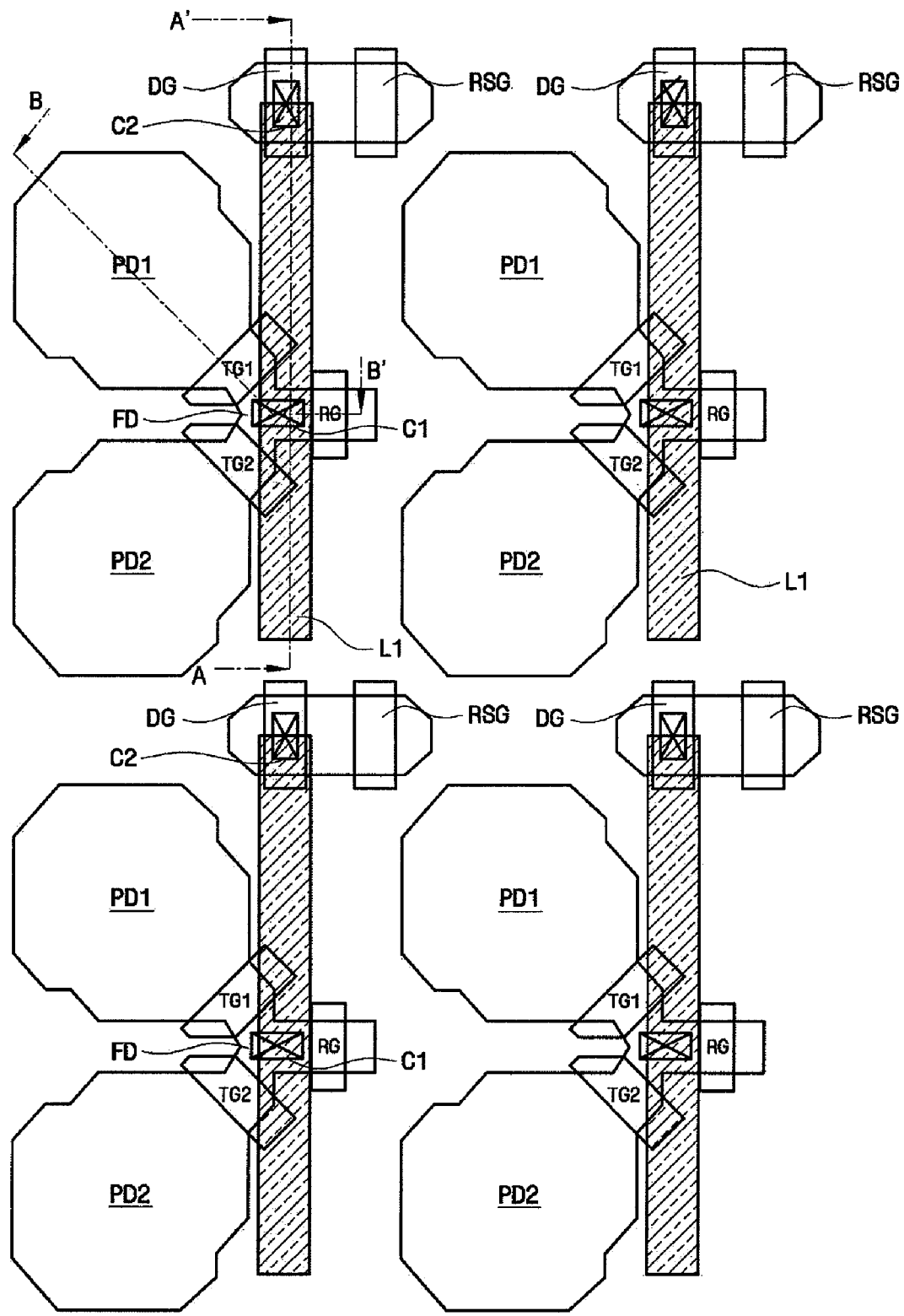
FIG. 4A is a layout diagram of the shared-pixel-type image sensor of FIG. 3A.
Figure 4B:
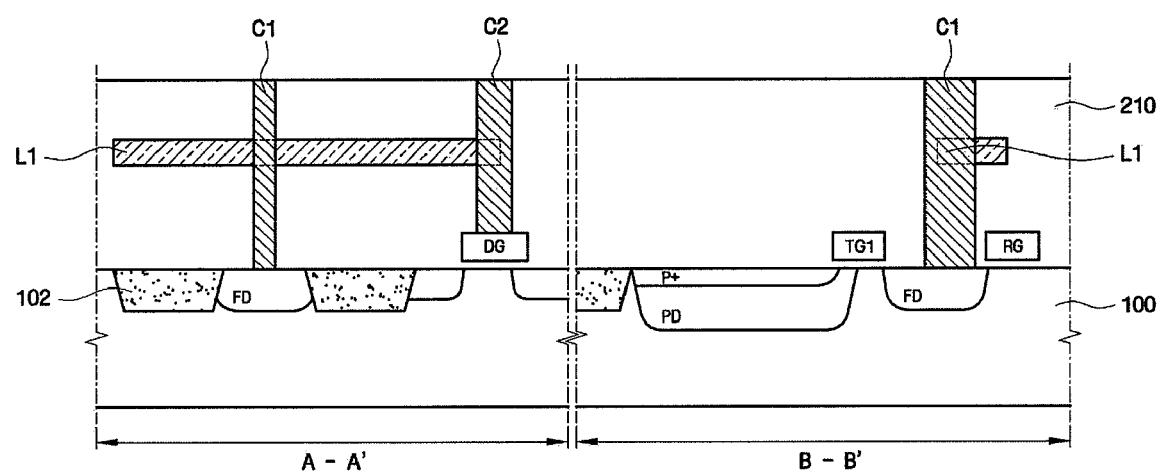
FIG. 4B is a cross-sectional view of the shared-pixel-type image sensor taken along section lines A-A' and B-B' of FIG. 4A.

FIG. 3A is a layout diagram of the shared-pixel-type image sensor according to the first exemplary embodiment of the present invention. FIG. 3B is a cross-sectional view of the shared-pixel-type image sensor taken along section lines A-A' and B-B' of FIG. 3A. FIGS. 4A and 4B are diagrams for explaining the shared-pixel-type image sensor according to the first exemplary embodiment of the present invention.

FIG. 4B is a cross-sectional view of the shared-pixel-type image sensor taken along section lines A-A' and B-B' of FIG. 4A.

Figure 5:
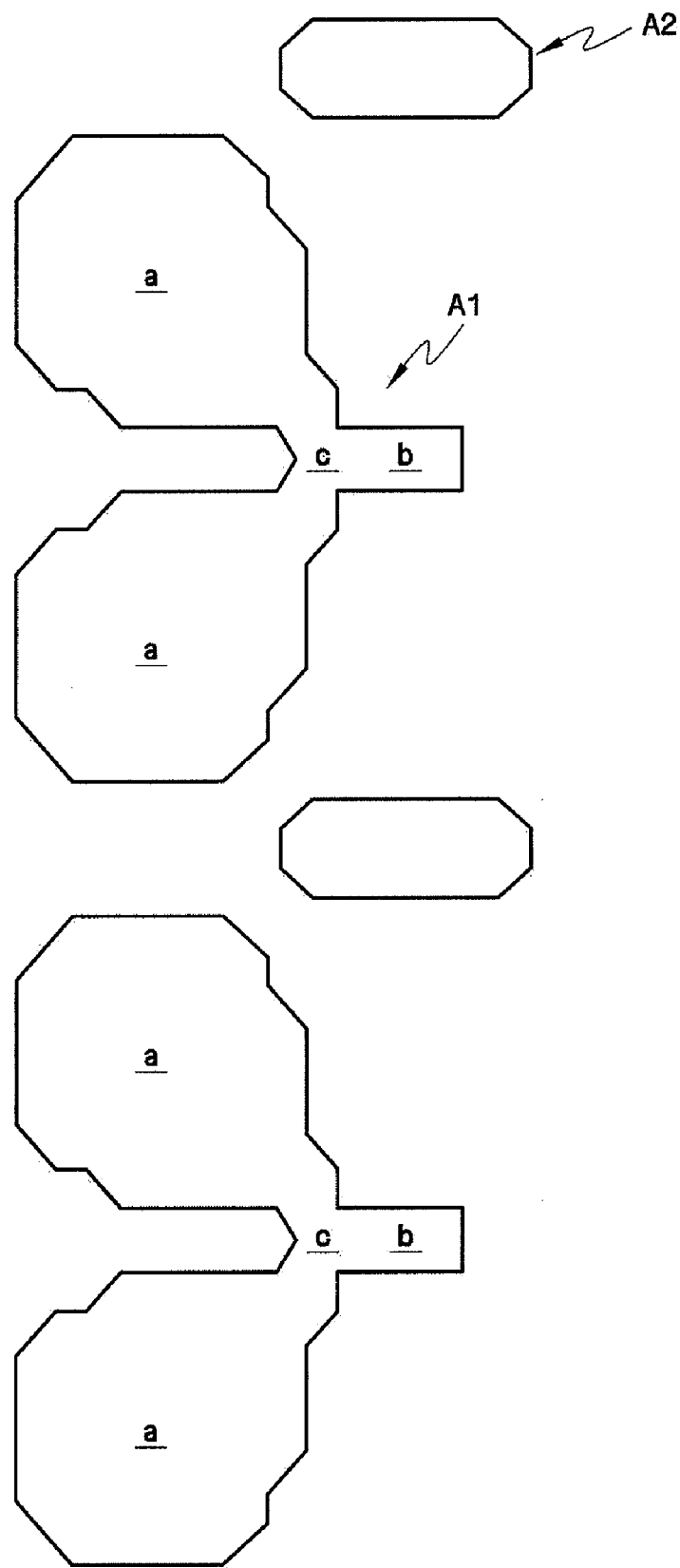
FIG. 5 is a layout diagram of an active region regions of a 2-pixel units of the shared-pixel-type image sensor according of FIG. 3A.

FIG. 5 is a layout diagram of an active region of a 2-pixel unit of the shared-pixel-type image sensor according to the first exemplary embodiment of the present invention.

Referring to FIGS. 3A through 5, the APS array of the shared-pixel-type image sensor according to the first embodiment includes a plurality of first active regions A1 arranged in a matrix and a plurality of second active regions A2 which are allocated to the first active regions A1, respectively. In each of the first active regions A1, two photoelectric conversion elements PD1 and PD2 sharing a floating diffusion region FD are formed. The second active regions A2 are independent active regions comprising a reading element. Thus, each pair of a first active region A1 and a corresponding second active region A2 form an active region of one of the 2-pixel groups P (see. FIG. 2). Reading elements, as used herein, read optical signals incident on photoelectric conversion elements. The reading elements may include, for example, the read enable switch (indicated by reference numeral 19 in FIG. 2), the drive element (indicated by reference numeral 17 in FIG. 2) and/or the reset element (indicated by reference numeral 18 in FIG. 2).

Each of the first active regions A1 is a one-axis-merged dual-lobe-type active region. Thus the first active regions A1 may be in the form of one-axis-merged dual lobes, while the second active regions A2 may be active regions not in form of merged dual lobes. Specifically, in each of the first active regions A1, dual lobe active regions "a" are merged with an axis active region "b" by a connecting active region "c". The dual lobe active regions "a" face each other and are symmetric with respect to the long axis of axis active region "b". Thus, each of the first active regions A1, i.e., the one-axis-merged dual-lobe type active regions, may have an outer appearance substantially similar to a dicotyledon which is composed of a hypocotyl and two cotyledons branching out from the hypocotyl. The dual lobe active regions "a", are adjacent to each other in the column direction of the APS array, are dual photoelectric conversion element active regions where the two photoelectric conversion elements PD1 and PD2 are formed, and the connecting active region "c" is a floating diffusion active region.

Three reading elements, including the reset element, the read enable switch and the drive element, may not be formed in a single active region. Instead, one of the reading elements may be formed in the axis active region "b" of each of the first active regions A1, and the other two of the reading elements may be formed in each of the second active regions A2. For example, a reset gate RG may be disposed in the axis active region "b" to form the reset element. And, the other two reading elements may be disposed in each of the second active regions A2. While the reset element is formed in the axis active region "b", the drive element and the read enable switch may be formed in each of the second active regions A2. Therefore, in each of the second active regions A2, a drive gate DG that forms the drive element. e.g., a source follower gate, and a select gate RSG that forms the read enable switch are disposed. The positions of the drive gate DG and the select gate RSG may be reversed according to a wiring method.

In each of the first active regions A1, which are the one-axis-merged dual-lobe type active regions, two transmission gates TG1 and TG2 (charge pass gates 15a and 15b in FIG. 2) may be formed between the dual lobe active regions "a" and the connecting active region "c", respectively.

Referring to FIGS. 3A, 3B, 4A, 4B and 5, a first contact C1 may be formed on each floating diffusion region FD of the APS array of the shared-pixel-type image sensor according to the first embodiment. In addition, a second contact C2 may be formed on the drive gate DG of each drive element. The first and second contacts C1 and C2 may penetrate an inter-layer insulating film 210 formed on a semiconductor substrate 100. The first and second contacts C1 and C2 are made of conductive materials and are buried in the inter-layer insulating film 210. In addition, the height of a top surface of the first contact C1 may be equal to that of a top surface of the second contact C2.

A local wire L1, that connects the first and second contacts C1 and C2 in a horizontal direction, is formed in the inter-layer insulating film 210. The local wire L1 connects the first and second contacts C1 and C2 to electrically connect the floating diffusion region FD to the drive gate DG. Here, the local wire L1 is formed at a level lower than the respective top surfaces of the first and second contacts C1 and C2.

The local wire L1 may extend in a direction parallel to the two photoelectric conversion elements PD1 and PD2 which are adjacent to each other in the column direction. The local wire L1 extends from the first contact C2 in the column direction towards the drive gate DG. The local wire L1 extends in the horizontal direction parallel to the two photoelectric conversion elements PD1 and PD2, which are adjacent to each other. Parts of the local wire L1, that extend in opposite directions from the first contact C1, may be symmetrical to each other with respect to the first contact C1. Alternatively, the part of the local wire L1, that extends from the first contact C1 in the direction toward the drive gate DG, may be longer than the part of the local wire L1 that extends in the opposite direction to the above direction in order to prevent the local wire L1 from being also connected to a reading element of an adjacent one of the 2-pixel groups P.

The local wire L1 may be shaped, for example, like the English character "W", and may be formed to a thickness of approximately 300 to 2,000 Å. A barrier film may be formed under the local wire L1, and an etch-stop film may be formed on the local wire L1.

As shown in FIGS. 3A and 3B, metal wires M1_1 and M1_2 may be formed on the inter-layer insulating film 210 having the first and second contacts C1 and C2 formed therein. The two metal wires M1_1 and M1_2 are shown in cross-section B-B'. However, the present invention is not limited thereto. The metal wires M1_1 and M1_2 may be the first of their kind (metal wires) to be formed on such an APS array, except for the local wire L1. The metal wires M1_1 and M1_2 may be wires connected to the transmission gates TG1 and TG2, wires connected to the select gate RSG, or wires which supply power. However, the present invention is not limited thereto. The metal wires M1_1 and M1_2 may be any kind of metal wires needed in the shared-pixel-type image sensor.

The metal wires M1_1 and M1_2 and the local wire L1 may be formed at different levels. Therefore, the metal wires M1_1 and M1_2 may partially overlap the local wire L1. Thus, the position of the local wire L1 need not be a consideration when the positions of the metal wires M1_1 and M1_2 are designed.

In FIGS. 3B and 4B, only one inter-layer insulating film 210 is shown between the metal wires M1_1 and M1_2 and the substrate 100. However, the present invention is not limited thereto. The inter-layer insulating film 210 may include a first inter-layer insulating film which is formed under the local wire L1 and a second inter-layer insulating film which is formed on the local wire L1. Alternatively, the inter-layer insulating film 210 may include three or more layers.

In the shared-pixel-type image sensor according to the present embodiment, the local wire L1 is additionally formed to connect the floating diffusion region FD and the drive gate DG. Thus, the number of lines of the metal wires M1_1 and M1_2, which need to be designed and disposed appropriately, can be reduced. Accordingly, it becomes easier to secure larger exposed areas of top surfaces of the photoelectric conversion elements PD1 and PD2, respectively, and to design the respective positions of the metal wires M1_1 and M1_2. In addition, in the shared-pixel-type image sensor, the local wire L1 extends perpendicular to the axis of symmetry of the two photoelectric conversion elements PD1 and PD2, which share the floating diffusion region FD and are adjacent to each other. Thus, the parts of the local wire L1 that overlap the transmission gates TG1 and TG2, that share the floating diffusion region FD, may be symmetrical to each other on either side of the axis of symmetry of the two photoelectric conversion elements PD1 and PD2. Therefore, coupling properties of the transmission gates TG1 and TG2 to the floating diffusion region FD can be enhanced.

Figure 6:
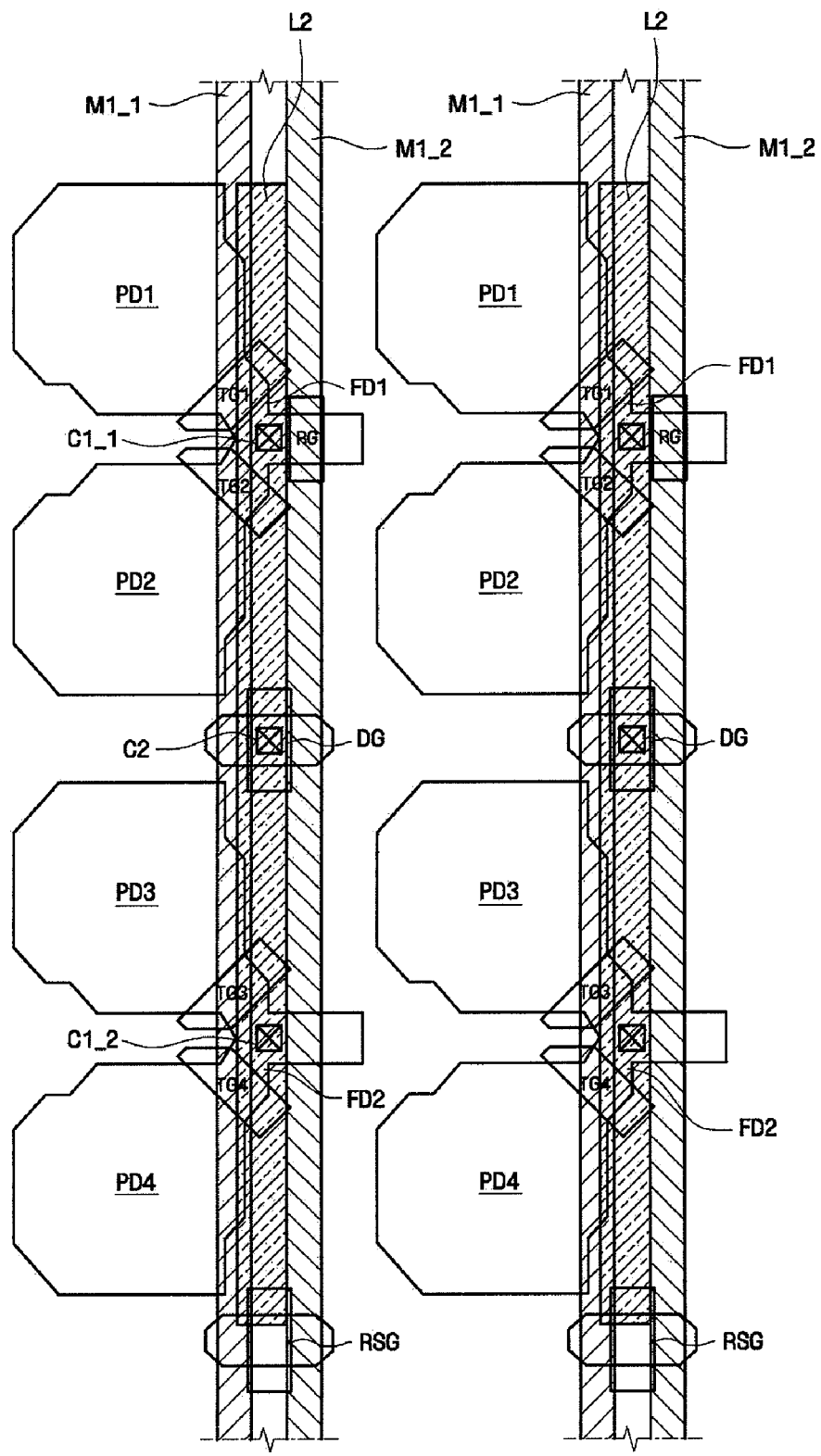
FIG. 6 is a layout diagram of a shared-pixel-type image sensor according to a second exemplary embodiment of the present invention.
Figure 7:
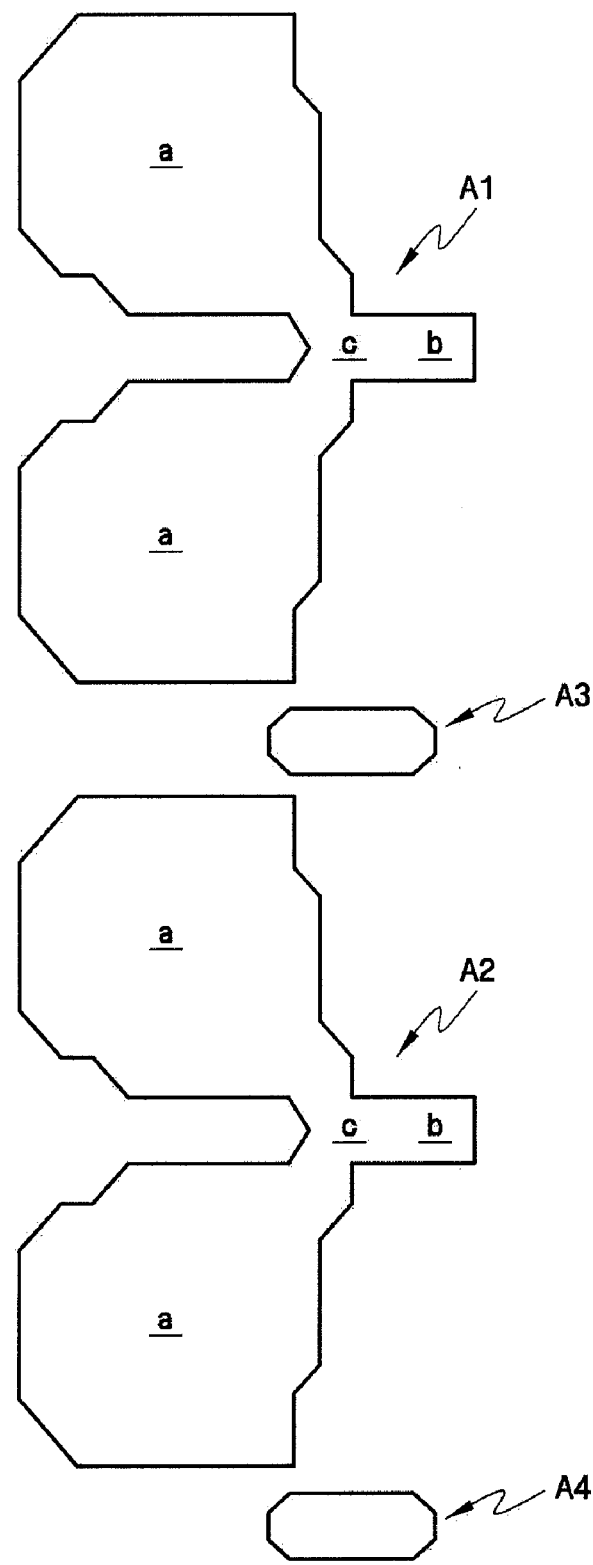
FIG. 7 is a layout diagram of an active region of a 4-pixel unit of the shared-pixel-type image sensor of FIG. 6.

Hereinafter, a shared-pixel-type image sensor according to a second exemplary embodiment of the present invention will be described with reference to FIGS. 6 and 7. FIG. 6 is a layout diagram of a shared-pixel-type image sensor according to the second exemplary embodiment of the present invention. FIG. 7 is a layout diagram of an active region of a 4-shared pixel of the shared-pixel-type image sensor according to the second exemplary embodiment of the present invention.

Referring to FIGS. 6 and 7, an APS array of the shared-pixel-type image sensor according to the present embodiment includes a plurality of pairs of first and second one-axis-merged dual-lobe-type active regions A1 and A2 and a plurality of pairs of third and fourth active regions A3 and A4 that correspond to the pairs of first and second active regions A1 and A2, respectively. The pairs of first and second one-axis-merged dual-lobe-type active regions A1 and A2 are repeated in a matrix, and the third and fourth active regions A3 and A4 are independent reading element active regions. In each of the first one-axis-merged dual-lobe-type active regions A1, two photoelectric conversion elements PD1 and PD2 sharing a first floating diffusion region FD1 are formed. In each of the second one-axis-merged dual-lobe-type active regions A2, two photoelectric conversion elements PD3 and PD4 sharing a second floating diffusion region FD2 are formed. The first through fourth active regions A1 through A4 form an active region unit of each of the 4-shared pixels P.

Each of the first and second active regions A1 and A2 are one-axis-merged dual-lobe type active regions. Specifically, dual lobe active regions "a" in each one of the first active regions A1 are two photoelectric conversion element active regions where the two photoelectric conversion elements PD1 and PD2 are formed. And a connecting active region "c" in each of the first active regions A1 is a floating diffusion region active where the first floating diffusion region FD1 is formed. Similarly, the two lobe active regions "a" in each of the second one-axis-merged dual-lobe-type active regions A2 are two photoelectric conversion element active regions where the two photoelectric conversion elements PD3 and PD4 are formed, and the connecting active region "c" in each of the second active regions A2 is a floating diffusion region where the second floating diffusion region FD2 is formed.

In each of the first one-axis-merged dual-lobe-type active regions A1, two transmission gates TG1 and TG2 may be formed between the dual lobe active regions "a" and the connecting active region "c", respectively. In addition, a reset gate RG may be disposed in an axis active region "b" of each of the first active regions A1 to form a reset element.

In each of the second one-axis-merged dual-lobe-type active regions A2, two transmission gates TG3 and TG4 may be formed between the dual lobe active regions "a" and the connecting active region "c", respectively. Since the second floating diffusion region FD2 is electrically connected to the first floating diffusion region FD1 by the local wire L2, electric charges transported to the second floating diffusion region FD2 may be read by a plurality of reading elements shared by the first floating diffusion region FD1.

One among three reading elements, (the reset element, the read enable switch or the drive element), a reading element is formed in the axis active region "b" of each of the first one-axis-merged dual-lobe-type active regions A1, and the other two reading elements are formed in each pair of third and fourth active regions A3 and A4, respectively, which are separated from each other. For example, as shown in FIG. 6, the reset gate RG may be formed in the axis active region "b", and a drive gate DG which forms the drive element is disposed in the third active region A3, and the select gate RSG which forms the read enable switch is disposed in the fourth active region A4, respectively.

In FIG. 6, the first floating diffusion region FD1, the second floating diffusion region FD2, and the drive gate DG of the drive element are connected to one another by the local wire L2. However, the present invention is not limited thereto. An interconnecting wire, that connects the first and second floating diffusion regions FD1 and FD2 may be formed, and the local wire L2 connected to the first floating diffusion region FD1, the second floating diffusion region FD2 or the interconnecting wire, may additionally be formed.

First contacts C1_1 and C1_2 may be formed respectively on the first and second floating diffusion regions FD1 and FD2 of the APS array of the shared-pixel-type image sensor according to the present embodiment. In addition, a second contact C2 may be formed on the drive gate DG. Specifically, the second contact C2 may be formed on the drive gate DG of each shared drive element.

The local wire L2 connecting the first contacts C1_1, C1_2 and second contact C2 in a horizontal direction, is formed in an inter-layer insulating film 210. The local wire L2 connecting the first contacts C1_1, C1_2 and the second contact C2 electrically connect the first and second floating diffusion regions FD1 and FD2 and the drive gate DG. Here, the local wire L2 is formed lower than the top surfaces of the first and second contacts C1_1, C1_2 and C2.

The local wire L2 extends toward the two first contacts C1_1 and C1_2 from the second contact C2. In addition, parts of the local wire L2 extends from each of the first contacts C1_1 and C1_2 in opposite directions toward the second contact C2. Thus, the local wire L2 extends parallel to each of the four photoelectric conversion elements PD1 through PD4, which are adjacent to one another, in the column direction. The local wire L2 may be shaped like, for example, the English character "W", and may be formed to a thickness of approximately 300 to 2,000 A. A barrier film may be formed under the local wire L2, and an etch-stop film may be formed on the local wire L2.

Metal wires M1_1 and M1_2 may be formed on the inter-layer insulating film 210 having the first contacts C1_1, C1_2 and second contacts C2 formed therein. In FIG. 6, the two metal wires M1_1 and M1_2 per column are shown. However, the present invention is not limited thereto. The two metal wires M1_1 and M1_2 may be the first of their kind to be formed on the APS array, except for the local wire L2. The metal wires M1_1 and M1_2 may be wires connected to the transmission gates TG1 and TG2, wires connected to the select gate RSG, or wires which supply power. However, the present invention is not limited thereto. The metal wires M1_1 and M1_2 may be any kind of metal wires which are needed in the shared-pixel-type image sensor.

The metal wires M1_1 and M1_2 and the local wire L2 may be formed at different levels. Therefore, the metal wires M1_1 and M1_2 may overlap the local wire L2. Thus, the position of the local wire L2 need not be taken into consideration when the positions of the metal wires M1_1 and M1_2 are designed.

Hereinafter, a method of fabricating the shared-pixel-type image sensor according to the first exemplary embodiment of the present invention will be described with reference back to FIGS. 3A through 4B.

Referring to FIGS. 3A through 4B, the APS array of the shared-pixel-type image sensor is formed on the semiconductor substrate 100, and first portion of the inter-layer insulating film 210 is deposited on the resultant structure. Next, a conductive film (not shown) is deposited on the first portion of the inter-layer insulating film 210 and then patterned to form the local wire L1. The local wire L1 extends between and above the floating diffusion region FD and the drive gate DG.

The second portion of the inter-layer insulating film 210 is formed on the local wire L1. Then, holes for the first and second contacts C1 and C2, which penetrate the inter-layer insulating film 210, are formed, and then filled. Here, the first contact C1 is connected to the floating diffusion region FD, and the second contact C2 is formed on the drive element. Specifically, the second contact C2 may be formed on the drive gate DG of the drive element. The first and second contacts C1 and C2 are connected to the local wire L1 to electrically connect the floating diffusion region FD to the drive gate DG.

Next, the metal wires M1_1 and M1_2 are formed on the inter-layer insulating film 210. The metal wires M1_1 and M1_2 are formed separate from the first and second contacts C1 and C2 and disposed such that larger areas of the top surfaces of the photoelectric conversion elements PD1 and PD2 can be exposed.

A similar method of fabricating the shared-pixel-type image sensor may also be used to fabricate the shared-pixel-type image sensor according to the second exemplary embodiment of the present invention (FIGS. 6 and 7).

Figure 8:
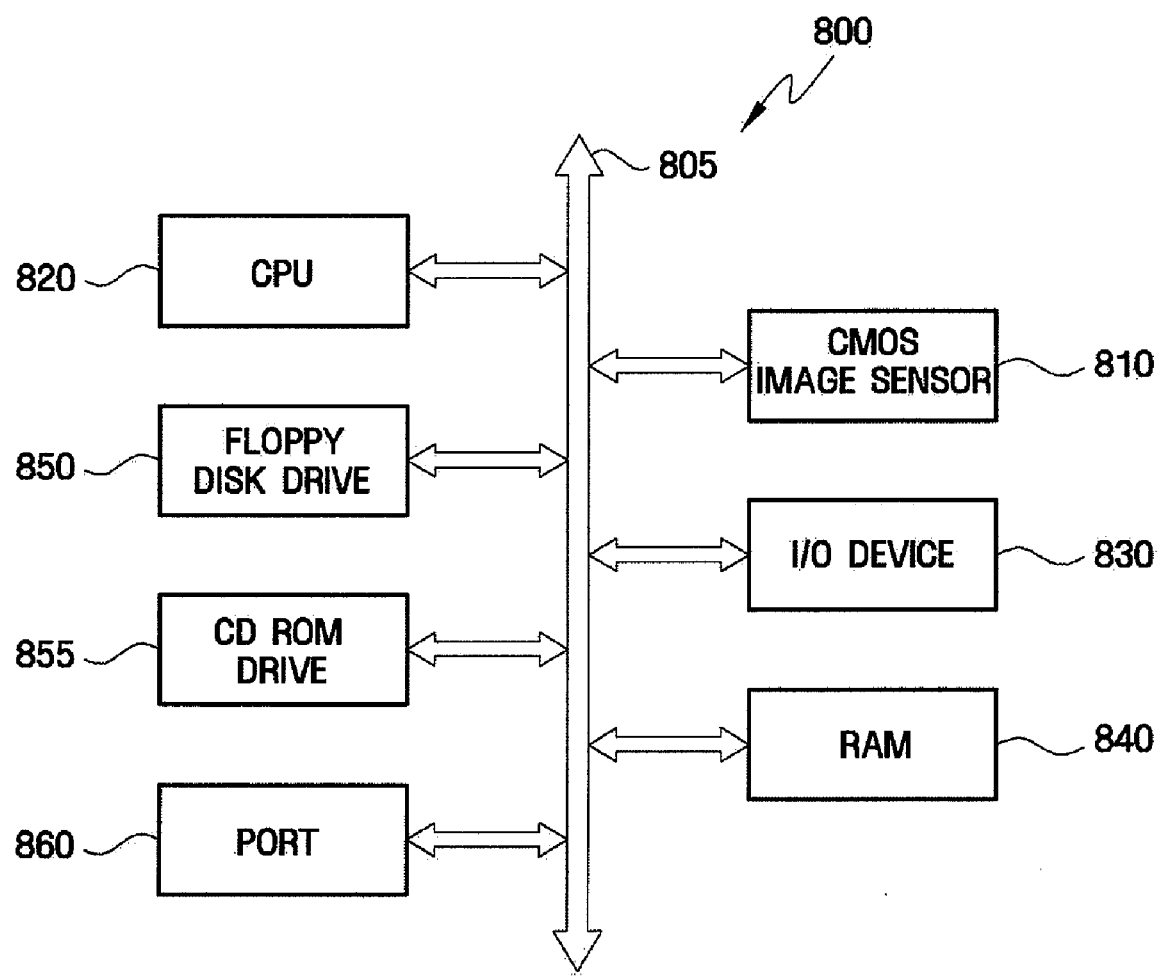
FIG. 8 is a schematic diagram of a processor-based system including a complementary metal-oxide semiconductor (CMOS) image sensor according to an exemplary embodiment of the present invention.

FIG. 8 is a schematic diagram of a processor-based system 800 including a CMOS image sensor 810 including dual one-axis-merged dual-lobe-type active regions according to exemplary embodiments of the present invention.

Referring to FIG. 8, the processor-based system 800 processes images output from the CMOS image sensor 810. The processor-based system 800 may be, but is not limited to, a computer system, a camera system, a scanner, a mechanized clock system, a navigation system, a videophone, a surveillance system, an automatic focus system, a tracking system, a motion detection system, or an image stabilization system.

The processor-based system 800 may include a central processing unit (CPU) (e.g., a microprocessor) 820 which may communicate with an input/output element 830 via a bus 805. The CMOS image sensor 810 may communicate with the processor-based system 801 via the bus 805 or any other communication link. The processor-based system 800 may further include a random access memory (RAM) 840, a floppy disk drive 850 and/or a compact disc read-only memory (CD ROM) drive 855, and a port 860, all of which may communicate with the CPU 820 via the bus 805. The port 860 may couple a video card, a sound card, a memory card, or a universal serial bus (USB) device to the processor-based system 800 or may perform data communication with other systems. The CMOS image sensor 810 may be integrated with the CPU 820, a digital signal processor (DSP), a microprocessor, a memory, or the like. The CMOS image sensor 810 may also be integrated on a separate semiconductor chip from the above processor.

In the shared-pixel-type image sensor according to the present invention, a separate local wire is formed to connect a floating diffusion region to a drive element. Thus, the number of lines of metal wires, which need to be designed and disposed appropriately, can be reduced. Consequently, it becomes easier to secure larger exposed areas of top surfaces of two adjacent photoelectric conversion elements, respectively, and to design the respective positions of the metal wires.

In addition, in the shared-pixel-type image sensor according to the present invention, a local wire extends parallel to the two photoelectric conversion elements (perpendicular to their axis of symmetry), which share the floating diffusion region and are adjacent to each other. Thus, the parts of each local wire may be symmetrical to each other with respect to transmission gates which share the floating diffusion region. Therefore, coupling properties of the transmission gates to the floating diffusion region can be enhanced.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A shared-pixel-type image sensor comprising:
   a floating diffusion region formed in a semiconductor substrate;
   first and second photoelectric conversion regions formed in the semiconductor substrate adjacent to each other in a first direction;
   two transmission elements that alternately transfer electric charges accumulated in the first and second photoelectric conversion regions to the floating diffusion region;
   a first shared drive element that outputs the electric charges of the floating diffusion region;
   a first contact formed on the floating diffusion region and having a top surface;
   a second contact formed on the first shared drive element and having a top surface; and
   a local wire that connects the first and second contacts to electrically connect the floating diffusion region and the first shared drive element,
   wherein the local wire is formed at a level lower than the respective top surfaces of the first and second contacts.

2. The image sensor of claim 1, wherein the first shared drive element is adjacent to the first photoelectric conversion region, and the local wire connects the first and second contacts and extends beyond the second contact towards a second shared drive element of another pixel.

3. The image sensor of claim 2, wherein first and second portions of the local wire are symmetrical to each other with respect to the first contact.

4. The image sensor of claim 1, wherein a first portion of the local wire extends from the first contact in a direction toward the second contact and a second portion of the local wire extends from the first contact in an opposite direction away from the second contact.

5. The image sensor of claim 1, wherein the height of the top surface of the first contact is equal to the height of the top surface of the second contact; and
   further comprising a plurality of metal wires extending in the first direction at a level higher than the top surfaces of the first and second contacts, wherein the metal wires are separated from the first and second contacts.

6. The image sensor of claim 5, wherein the local wire and the metal wires are formed at different levels.

7. The image sensor of claim 5, wherein the metal wires are separated from each other in a second direction.

8. A shared-pixel-type image sensor comprising:
four photoelectric conversion regions which are formed in a semiconductor substrate and are adjacent to one another in a column direction;
two transmission elements that transfer electric charges accumulated in two adjacent photoelectric conversion regions of the four photoelectric conversion regions to a first shared floating diffusion region;
another two transmission elements that transfer electric charges accumulated in the other two adjacent photoelectric conversion regions of the four photoelectric conversion regions to a second shared floating diffusion region;
a first contact formed on the first shared floating diffusion region;
a second contact formed on the second shared floating diffusion region;
a third contact formed on a shared drive element; and
a local wire that connects the first through third contacts to electrically connect the first and second shared floating diffusion regions to the shared drive element,
wherein the local wire is formed at a level lower than respective top surfaces of the first through third contacts.

9. The image sensor of claim 8, wherein the shared drive element is formed between the first shared floating diffusion region and the second shared floating diffusion region, and the local wire extends in opposite directions from the third contact toward each of the first and second contacts.

10. The image sensor of claim 9, wherein the local wire further extends the same predetermined distance beyond each of the first and second contacts.

11. The image sensor of claim 8, wherein the first through third contacts are formed at the same level and
further comprising a plurality of metal wires extending in a column direction on a level as the top surfaces of the first through third contacts, wherein the metal wires are separated from the first through third contacts.

12. The image sensor of claim 11, wherein the local wire and the metal wires are formed at different levels, and the metal wires at least partially overlap e the local wire.

13. The image sensor of claim 11, wherein the metal wires are separated from each other.

* * * * *